(12) United States Patent
Patasani et al.

(10) Patent No.: US 8,994,459 B2
(45) Date of Patent: Mar. 31, 2015

(54) OSCILLATOR ARRANGEMENT FOR GENERATING A CLOCK SIGNAL

(71) Applicant: NXP B.V., Eindhoven (NL)

(72) Inventors: Manoj Kumar Patasani, Hamburg (DE); Ronak Prakashchandra Trivedi, Bangalore (IN)

(73) Assignee: NXP B.V., Eindhoven (NL)

(*) Notice: Subject to any disclaimer, the term of this patent is extended or adjusted under 35 U.S.C. 154(b) by 14 days.

(21) Appl. No.: 13/929,686

(22) Filed: Jun. 27, 2013

(65) Prior Publication Data

US 2014/0002197 A1 Jan. 2, 2014

(30) Foreign Application Priority Data

Jun. 28, 2012 (EP) .................................. 12174201

(51) Int. Cl.
*H03L 7/099* (2006.01)
*H03L 1/00* (2006.01)
*H03L 7/02* (2006.01)

(52) U.S. Cl.
CPC ... *H03L 1/00* (2013.01); *H03L 7/02* (2013.01)
USPC .......................... 331/1 R; 331/34; 331/177 R

(58) Field of Classification Search
CPC .............................. H03K 3/0315; H03L 7/02
USPC ............. 331/57, 16, 34, 177 R, 1 R; 327/156
See application file for complete search history.

(56) References Cited

U.S. PATENT DOCUMENTS

| | | | |
|---|---|---|---|
| 4,285,345 A | 8/1981 | Mensink et al. | |
| 5,331,295 A | 7/1994 | Jelinek et al. | |
| 6,229,403 B1* | 5/2001 | Sekimoto | 331/57 |
| 6,342,817 B1* | 1/2002 | Crofts et al. | 331/1 R |
| 6,353,368 B1 | 3/2002 | Iravani | |
| 6,614,313 B2* | 9/2003 | Crofts et al. | 331/1 R |
| 6,664,826 B1* | 12/2003 | Creed et al. | 327/147 |
| 2011/0181262 A1 | 7/2011 | Deguchi | |
| 2012/0074986 A1 | 3/2012 | Nakamura et al. | |

FOREIGN PATENT DOCUMENTS

WO 2009/013301 A1 1/2009

OTHER PUBLICATIONS

Abidi, A. A. "Linearization of Voltage-Controlled Oscillators Using Switched Capacitor Feedback", IEEE Journal of Solid-State Circuits, vol. 22, No. 3, pp. 494-496 (Jun. 1987).
Nguyen, P. T. L et al. "High Linearity Voltage-Controlled Oscillator", IEEE 8th International Conference on ASIC, pp. 363-366 (Oct. 2009).
Cui, S. et al. A High Linear CMOS Current-Controlled Oscillator Using a Novel Frequency Detector >>, IEEE International Symposium on Circuits and Systems, pp. 2841-2844 (May 2008).
Extended European Search Report for Patent Appln. No. 12174201.9 (Nov. 27, 2012).

* cited by examiner

*Primary Examiner* — Arnold Kinkead

(57) ABSTRACT

There is provided an oscillator arrangement for generating a clock signal. The oscillator arrangement comprises a current controlled oscillator, a frequency to voltage converter, and an operational amplifier. The oscillator arrangement is connectable to a supply voltage source. In one embodiment, the oscillator arrangement may achieve a stable clock frequency insensitive to supply and temperature variation with low current consumption and low area. This may be achieved by using Vref and Vout as input signals to the operational amplifier, both signals being directly derived from the supply voltage. In a further embodiment, a trimming resistor may be used in the frequency to voltage converter for adjusting the frequency.

13 Claims, 3 Drawing Sheets

OSCILLATOR ARRANGEMENT FOR GENERATING A CLOCK SIGNAL

CROSS-REFERENCE TO THE RELATED APPLICATIONS

This application claims the priority under 35 U.S.C. §119 of European patent application no. 12174201.9, filed on Jun. 28, 2012, the contents of which are incorporated by reference herein.

FIELD OF THE INVENTION

The invention relates to an oscillator arrangement for generating a clock signal.

Further, the invention relates to a semiconductor device comprising the oscillator arrangement.

Beyond this, the invention relates to a method of generating a clock signal.

Moreover, the invention relates to a computer-readable medium.

Furthermore, the invention relates to a program element.

BACKGROUND OF THE INVENTION

In semiconductor devices, for instance Systems on a Chip (SoC), a clock signal typically needs to be generated for many applications and functions. Conventionally, phase locked loop (PLL's) are used for clock generation in bigger SoCs as they faithfully multiply a reference crystal clock to a stable high frequency clock. The negative feedback loop in PLL's generates a supply, temperature and process in-sensitive clock with very small frequency spread. However, in smaller systems with limited PAD/PIN, PLL's are not cost effective solution as they need an external reference crystal clock. So, one possibility is to use a reference oscillator in a negative feedback loop to mimic the PLL performance.

As the on chip resistors and capacitors vary across process, frequency of the oscillator may also vary significantly affecting the system performance. All digital systems process and manipulate only digital codes consisting of 0's and 1's. Since typically the output frequency of the voltage controlled oscillator (VCO) is controlled by an analog input voltage, a digital to analog converter (DAC) is usually used to convert trimming bits to an analog voltage and then to program the frequency. A conventional DAC implementation scheme may consume almost 70-80% area of the oscillator and also the DAC power consumption may become an over head to the overall system.

In common VCO implementations, a negative feedback loop may be used to linearize the VCO. But any mismatch between control voltage (Vctl) and reference voltage (Vref) can lead to non-linearity.

US 2012/0074986 A1 discloses a generation of a clock signal. A frequency-voltage conversion circuit includes a switch portion including switches, electrostatic capacitive elements, and other switches. The electrostatic capacitive elements have different absolute capacitance values, and are provided so as to cover a frequency range intended by a designer. For example, based on 4-bit frequency adjustment control signals, the other switches select the electrostatic capacitive elements having the electrostatic capacitance values thereof each weighted with 2 to perform the switching of a frequency.

Thus, there may be a need for an improved oscillator arrangement being insensitive to temperature and voltage variations.

OBJECT AND SUMMARY OF THE INVENTION

It is an object of the invention to provide an oscillator arrangement and method for generating a clock signal being insensitive to changes of a power supply and variations of temperature.

In order to achieve the object defined above, an oscillator arrangement, a semiconductor device, a generating method, a computer-readable medium and a program element according to the independent claims are provided.

According to an exemplary embodiment of the invention, there is provided an oscillator arrangement for generating a clock signal. The oscillator arrangement comprises a current controlled oscillator, a frequency to voltage converter, and an operational amplifier. The oscillator arrangement is connectable to a supply voltage source (like a standard supply voltage VDD, in particular AVDD for analog circuit parts). The current controlled oscillator is adapted to generate a clock signal based on a control voltage signal, wherein the generated clock signal is supplied to the frequency to voltage converter. The frequency to voltage converter is adapted to generate an output voltage signal (Vout) based on the generated clock signal and based on the supply voltage signal. The operational amplifier is adapted to receive the output voltage signal as a feedback signal at a first (for instance the positive) input terminal and to receive a reference voltage signal (Vref) at a second (for instance the negative) input terminal, the reference voltage signal (Vref) being generated from the supply voltage signal. The current controlled oscillator is adapted to be controlled based on an output signal of the operational amplifier, wherein the output signal provides the control voltage signal to the current controlled oscillator in order to control the frequency of the clock signal.

According to a further exemplary embodiment, a semiconductor device is provided, wherein the semiconductor device comprises the oscillator arrangement having the above mentioned features.

According to a further exemplary embodiment, a method of generating a clock signal is provided. The method comprises generating, by a current controlled oscillator, a clock signal based on a control voltage signal, wherein the generated clock signal is supplied to a frequency to voltage converter, generating, by the frequency to voltage converter, an output voltage signal based on the generated clock signal and based on the supply voltage signal, receiving, by an operational amplifier, the output voltage signal as a feedback signal at a first input terminal and receiving, by the operational amplifier, a reference voltage signal at a second input terminal, the reference voltage signal being generated from the supply voltage signal, and controlling the current controlled oscillator based on an output signal of the operational amplifier, wherein the output signal provides the control voltage signal to the current controlled oscillator in order to control the frequency of the clock signal.

According to a further exemplary embodiment, a computer-readable medium is provided, in which a computer program of generating a clock signal is stored, which computer program, when being executed by a processor, is adapted to carry out or control a method having the above mentioned features.

According to still another exemplary embodiment, a program element (for instance a software routine, in source code or in executable code) of generating a clock signal is provided, which program element, when being executed by a processor, is adapted to carry out or control a method having the above mentioned features.

Generating a clock signal, which may be performed according to embodiments of the invention, can be realized by a computer program that is by software, or by using one or more special electronic optimization circuits, that is in hardware, or in hybrid form, that is by means of software components and hardware components.

This invention describes an improved oscillator arrangement which produces a pre-determined stable clock and is in-sensitive to supply and temperature variation. In the herein described oscillator arrangement, both feedback voltage and reference voltage are generated from the same supply voltage. Therefore any noise on the supply may become a common-mode noise for both amplifier inputs and hence are rejected by amplifier gain. Therefore, the oscillator becomes insensitive to supply variations.

In common design, frequency to voltage conversion (F2V) has been achieved with switched cap technique. However, this leads to the use of an additional operational amplifier (Op-amp) which is not attractive from a "needed area" and "needed power" point of view. The herein described oscillator arrangement may achieve the same performance without the additional amplifier thereby making it attractive as a low-power and low area F2V solution.

In the herein described oscillator arrangement, the oscillator frequency is insensitive to supply variation as both reference voltage and feedback voltage are generated from the same supply.

In the operational amplifier, the first input terminal may be the positive input terminal and the second input terminal may be the negative input terminal, or vice versa. This may depend on the frequency to voltage converter. If there is a sign change in the converter, the input terminals may be changed.

In the following, further exemplary embodiments of the oscillator arrangement will be explained. However, these embodiments also apply to the semiconductor device, the generating method, to the program element and to the computer-readable medium.

The oscillator arrangement may further comprise an NMOS device, wherein the current controlled oscillator is connectable to the supply voltage source via the NMOS device, the NMOS device being controlled by the output signal of the operational amplifier.

The NMOS device may be adapted to convert an output error voltage corresponding to the output signal of the operational amplifier into a current for controlling the current controlled oscillator.

The NMOS device may be a native-NMOS device used to convert an input error voltage to a current which in turn controls the delay of an inverter chain in the current controlled oscillator (CCO). The CCO may generate a clock with a time period equal to $1/(2*N*Td)$ where N is the numbers of delay cells (inverters) in loop and Td is the delay of each inverter. The advantage of native-NMOS may be that Vt of this device can almost be zero hence $V_{GS}$ can be as low as ~100 mV and Op-amp output stage cascode devices can be biased properly. Also it may work as a source follower with gain ~1 and therefore does not impact loop dynamics. Using a PMOS device in place of native NMOS might add one more gain stage and might impact the close loop stability.

The oscillator arrangement may further comprise a voltage divider being adapted to generate the reference voltage from the supply voltage signal, wherein the voltage divider is coupled between the voltage supply and the second input terminal of the operational amplifier.

The reference voltage (Vref) may be generated by a voltage divider from the supply AVDD. OP-amp gain and negative feedback may ensure Vref and Vout to be the same. A capacitor may be used to push the op-amp dominant pole towards origin thereby improving the closed loop phase margin and loop stability.

The oscillator arrangement may further comprise a level shifter unit being coupled between the current controlled oscillator and the frequency to voltage converter, wherein the level shifter unit is adapted to convert the clock signal being generated by the current controlled oscillator into a rail-to-rail clock signal.

As the CCO output clock is not a rail to rail clock, level shifters may be used to convert CCO output clock to a rail to rail clock (fout), which provides the clock signal being generated by the complete oscillator arrangement.

The frequency to voltage converter may be adapted to generate the output voltage signal based on the rail-to-rail clock signal.

Instead of using the clock signal directly from the CCO, the frequency to voltage converter may use the generated rail-to-rail clock signal fout.

The frequency to voltage converter may be implemented based on a switched capacitor resistor arrangement.

This arrangement may provide the advantage that, as resistors and capacitors are largely insensitive to temperature variation, the oscillator frequency is stable across temperature range.

The frequency to voltage converter may comprise a trimming resistor being part of the switched capacitor resistor arrangement, wherein the value of the trimming resistor is adjustable in order to adapt the frequency of the switched capacitor resistor arrangement.

This may provide a highly efficient low-power and low-area trimming option to control the process spread.

The values of resistors (R) and capacitors (C) may vary a lot across process, so the frequency of the oscillator may also vary accordingly. To compensate the process spread, the trimming resistor R may be trimmed in a binary fashion to switch back to nominal frequency.

As can be seen from equation [3] shown below, the absolute oscillator frequency may be dependent on R and C values. R and C remain fairly constant across temperature variation and as a result oscillator frequency does not change across temperature. It may be convenient to change R and C absolute values to change the frequency of the oscillation.

The trimming resistor may comprise a plurality of resistors, each resistor being controlled by a transistor.

Digital trimming bits can be used to switch the transistors (ON/OFF MOS switches) and add capacitors in parallel or resistors in series. Therefore, process spread can easily be controlled without using digital-to-analog converters and hence area saving may be in the order of 70-80%.

The frequency to voltage converter may comprise a logic unit, the logic unit being adapted to change a frequency operation mode of the oscillator arrangement.

For instance, an oscillator which is designed for 100 MHz operation can easily be switched to operate at 200 MHz with the same core and the additional logic unit. The logic unit may comprise a switch-capacitor arrangement, being similar to the switched capacitor arrangement as described above.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
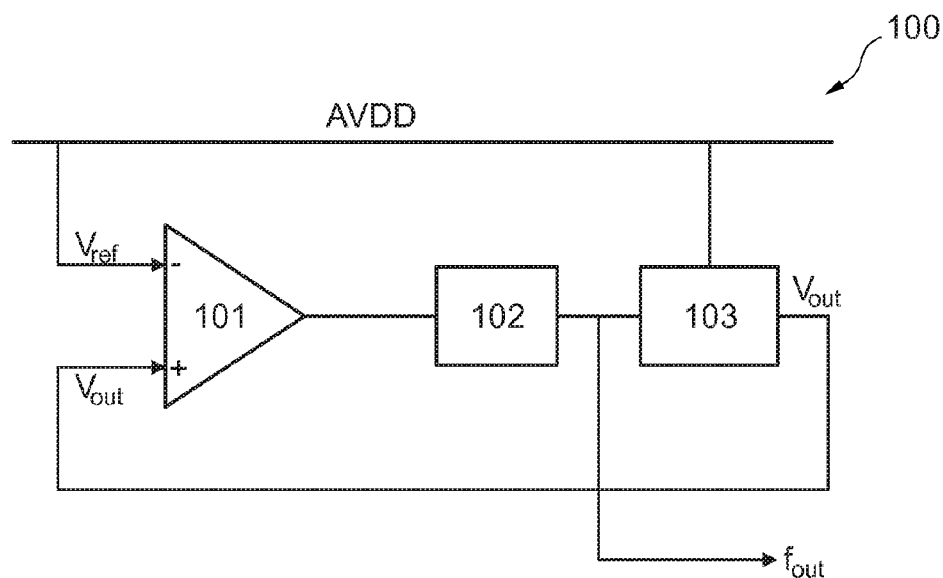
FIG. 1 illustrates an oscillator arrangement according to an exemplary embodiment of the invention.

The illustration in the drawing is schematically. In different drawings, similar or identical elements are provided with the same reference signs.

As shown in FIG. 1, the described oscillator arrangement 100 comprises a current controlled oscillator 102, a frequency to voltage converter 103, and an operational amplifier 101. The oscillator arrangement is connectable to a supply voltage source, being available via the supply line AVD or AVDD.

The current controlled oscillator 102 is adapted to generate a clock signal fout based on a control voltage signal. The generated clock signal is supplied to the frequency to voltage converter 103. The frequency to voltage converter 103 generates an output voltage signal Vout based on the generated clock signal fout and based on the supply voltage signal.

The operational amplifier 101 receives the output voltage signal Vout as a feedback signal at a first (here the positive) input terminal and receives a reference voltage signal Vref at a second (here the negative) input terminal. The reference voltage signal Vref is generated from the supply voltage signal. An output signal of the operational amplifier is used for generating the control voltage signal for controlling the current controlled oscillator in order to control the frequency of the clock signal.

Both input signals to the Op-amp 101 are derived from the supply voltage. Thus, variations in the supply voltage will have no influence to the oscillator arrangement 100.

Figure 2:
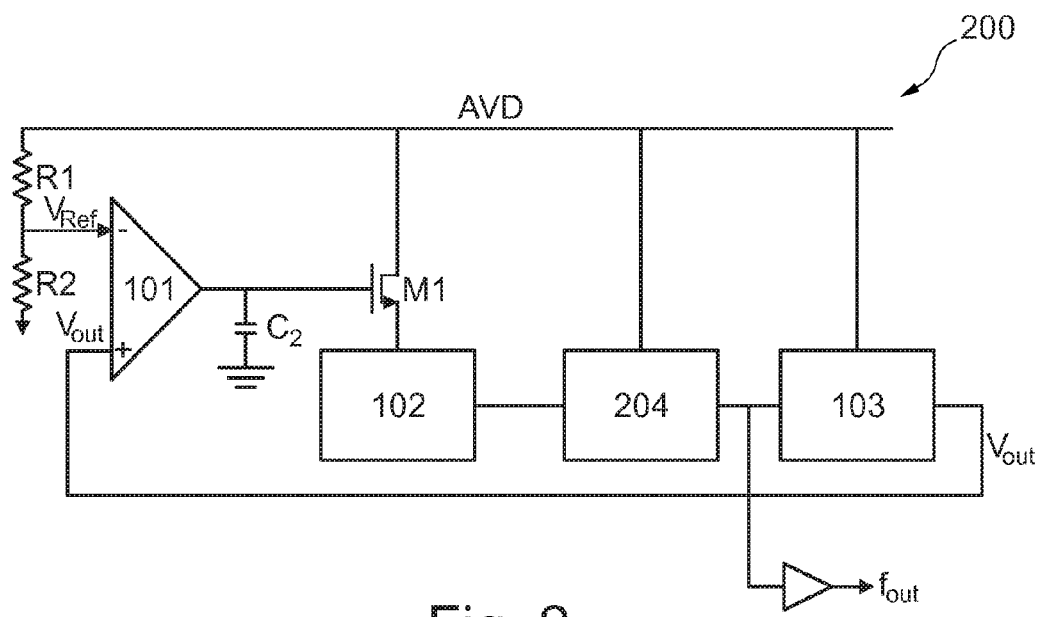
FIG. 2 illustrates an oscillator arrangement according to a further exemplary embodiment of the invention.

In FIG. 2, a further embodiment of an oscillator arrangement 200 is shown. The reference voltage (Vref) is generated by a voltage divider R1, R2 from supply AVDD. OP-amp gain and negative feedback may ensure that Vref and Vout are the same. C2 is used to push the op-amp dominant pole towards origin, thereby improving the closed loop phase margin and loop stability. M1 may be a native-NMOS device used to convert the input error voltage to a current which in turn controls the delay of inverter chain in current controlled oscillator (CCO) 102. CCO generates a clock with time period equal to 1/(2*N*Td) where N is the numbers of delay cells (inverters) in loop and Td is the delay of each inverter. The advantage of the native-NMOS M1 is that Vt of this device can almost be zero hence VGS can be as low as ~100 mV and Op-amp output stage cascode devices can be biased properly. Also it works as a source follower with gain ~1 and therefore does not impact loop dynamics. Using a PMOS device in place of native NMOS (M1) will add one more gain stage and will impact the close loop stability.

The CCO output swing is not a rail to rail clock, hence a level shifter unit 204 may be used to convert CCO output to a rail to rail clock fout. Frequency to voltage converter (F2V) 103 is used to convert the input frequency to a voltage (Vout) which is then compared with Vref. Vout and Vref are here connected to + and − terminal of the amplifier as there may be a signal inversion in F2V, as will be shown below in FIG. 6.

Figure 3:
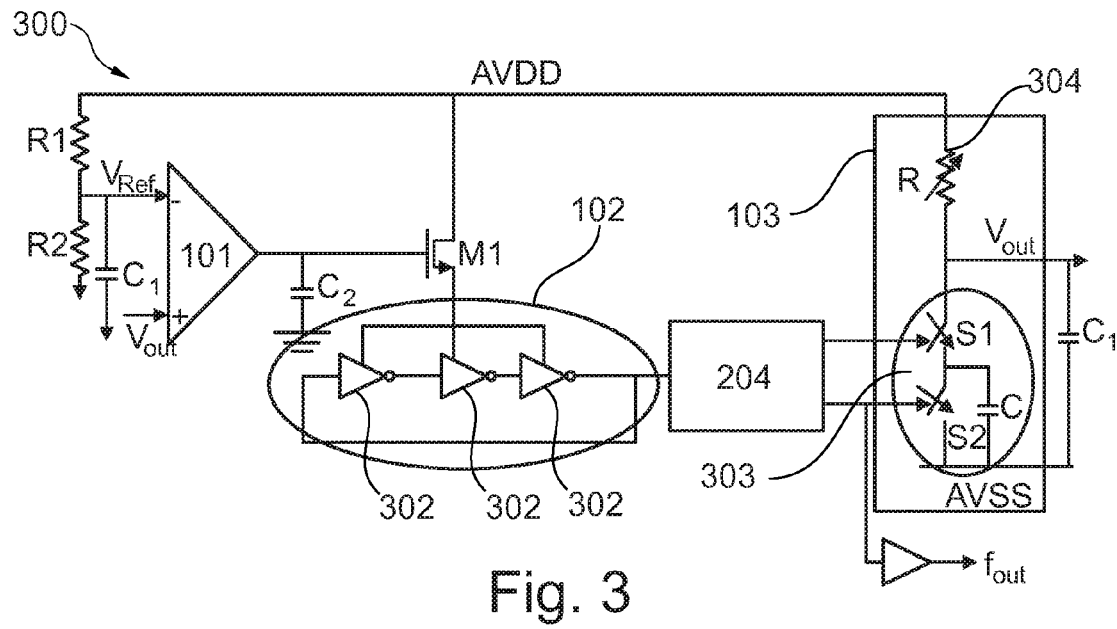
FIG. 3 illustrates an oscillator arrangement according to a further exemplary embodiment of the invention.

A further embodiment of the oscillator arrangement 300 illustrating a complete implementation of CCO and F2V is shown in FIG. 3. F2V 103 is implemented using switched capacitor technique by having a switched capacitor 303 in combination with a trimming resistor 304. At steady state S1, S2 and C form a equivalent resistor equal to 1/(Frequency steady-state*C). Similar to Vref, Vout is also derived directly from supply AVDD. Any noise on the supply will directly appear on Vref and Vout. Since random supply noise appears on both Vref and Vout in same amplitude and phase hence this common mode noise is rejected by the amplifier 101. Therefore, the oscillator frequency does not react to supply variation. As can be seen, the oscillator 102 can be implemented by a cascade of inverters 302, forming an inverter chain.

In one embodiment, for generating Vref, R1 and R2 are selected in such a way that R2=2*R1. Based on this, Vref may be calculated by $$Vref = R2*AVDD/(R1+R2) = (2/3)*AVDD = AVDD/1.5 \qquad (1)$$

and Vout may be calculated by $$Vout = R'*AVDD/(R+R') \text{ where } R' = 1/(\text{Frequency steady-state}*C)$$

such that $$Vout = AVDD/(1+Freq*R*C) \qquad (2)$$

Because of amplifier high gain and negative feedback loop, at steady state, Vref may be equal to Vout
From (1) and (2), it follows that $$AVDD/1.5 = AVDD/(1+Freq*R*C)$$

$$1+Freq*R*C = 1.5$$

$$Freq*R*C = 0.5$$

$$Freq = 0.5/(R*C) \qquad (3)$$

From equation (3), frequency of oscillator is completely decided by R and C absolute values (as shown in FIG. 3). Since R and C absolute values are independent of supply and are having almost zero temperature coefficients, the frequency of the oscillator is stable across different supply and temperature. However, the resistor R may have a small temperature gradient (1-2%) across −40 to 125 degrees. Hence, the frequency of the oscillator may drift 1-2% across −40 to 125 degrees.

Figure 4:
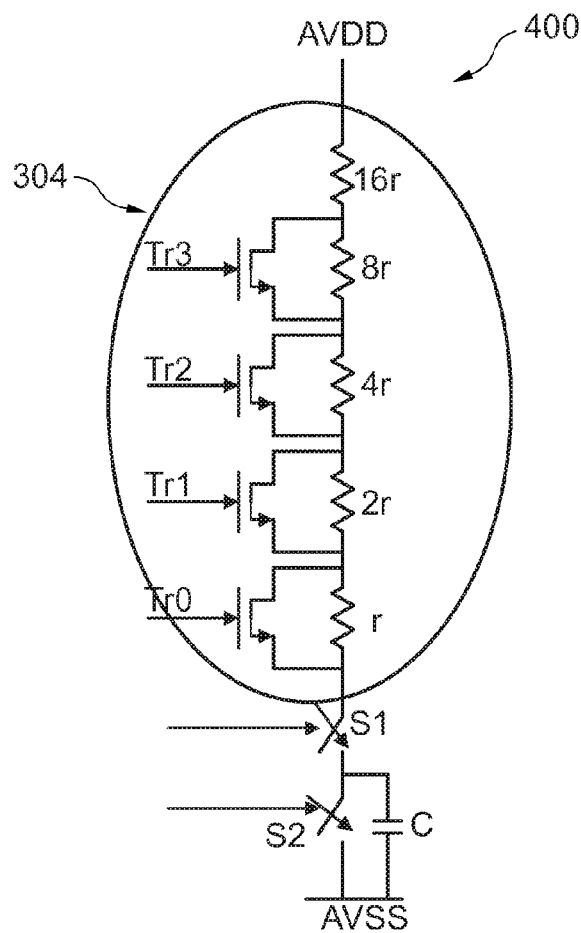
FIG. 4 illustrates a frequency to voltage converter for an oscillator arrangement according to an embodiment of the invention.

It may be the case that both R and C vary a lot across process so the frequency of the oscillator will also vary accordingly. To compensate the process spread, R may be trimmed in a binary fashion as shown in FIG. 4 to switch back to nominal frequency. Although C can be trimmed by switching a bank of parallel capacitors, it is chosen in this embodiment to trim R only as it gives an area advantage than later.

As can be seen in the embodiment 400 of FIG. 4, the trimming resistor R 304 comprises a plurality of resistors, each of which (except of one) being controllable by a transistor Tr0-Tr4. The resistors have different values (r to 16r). By switching on and off the resistors, the absolute value of the trimming resistor 304 may be adjusted.

This trimming scheme may provide the advantage that digital bits are directly used to change the absolute R value and hence the frequency of the oscillator. Conventionally, DACs were used convert digital bits to analog voltage or current and then control the frequency of oscillation. In contrast to this common approach, the current trimming implementation may have a 70-80% area and power advantage compared to conventional oscillators in earlier designs.

Figure 5:
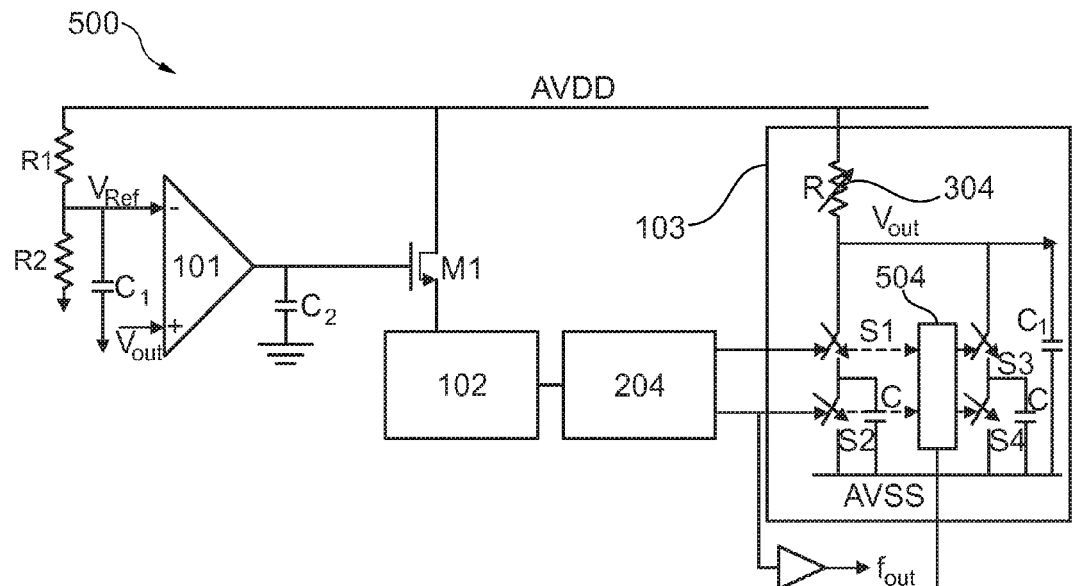
FIG. 5 illustrates an oscillator arrangement according to a further exemplary embodiment of the invention.

As shown in FIG. 5, with an additional logic unit 504, the oscillator arrangement 500 can be programmed to oscillate in different modes, for instance either in 100 MHz or 200 MHz. The additional logic 504 may enable switches S3 and S4 to operate in the same phase as S1 and S2 or be in off state. When S3 and S4 are OFF, the frequency of oscillation is given in equation (3) so that $$\text{Freq1}=0.5/(R*C) \qquad (4)$$

When S3 and S4 are ON and in the same phase as S1 and S2 respectively, $$V\text{out}=R''*AVDD/(R+R'') \text{ where } R''=R' \text{ parallel } R'=R'/2 \text{ where } R'=1/(\text{Freq steady-state}*C) \qquad (5)$$

so that $$V\text{out}=AVDD/(1+2*\text{Freq2}*R*C) \qquad (6)$$

When Vref=Vout, it follows from (1) and (6) that $$AVDD/1.5=AVDD/(1+2*\text{Freq2}*R*C)$$

$$1+2*\text{Freq2}*R*C=1.5$$

$$2*\text{Freq2}*R*C=0.5$$

$$\text{Freq2}=0.5/(2*R*C)=(\tfrac{1}{2})*\text{Freq1} \qquad (7)$$

So if Freq1 (with S3 and S4 OFF) is designed for 200 MHz, Freq2 (S3 and S4 ON) would oscillate at 100 MHz.

Figure 6:
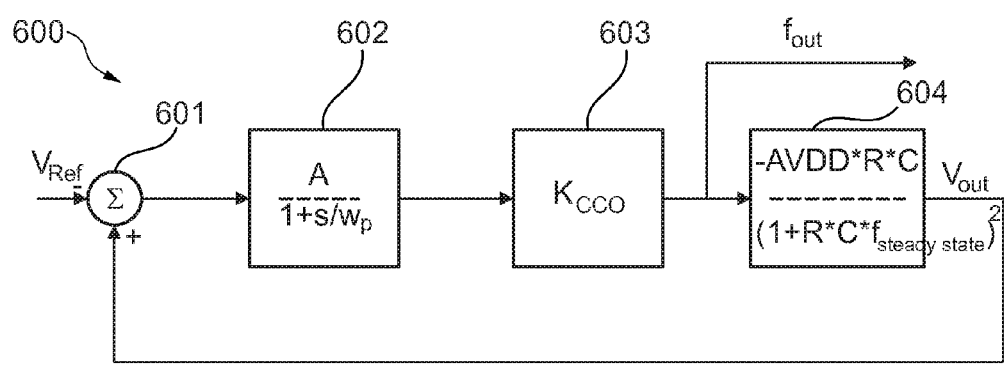
FIG. 6 illustrates an oscillator loop function according to an embodiment of the invention.

In FIG. 6, an oscillator loop transfer function 600 is shown. To a first order approximation, Op-amp may be assumed a single pole system with dominant pole created by C1 and Rout. So, the transfer function may be Op-amp=A/(1+s/Wp) (602), where Wp is the dominant pole frequency. The transfer function (603) of CCO may be K Hz/Volt.

The transfer function 604 of the frequency to voltage converter may be $d(V\text{out})/d(\text{Fin})=-AVDD*R*C/[(1+R*C*\text{Freq ss})^2]$, wherein Freq ss may be the frequency at steady state.

At low frequencies, $f\text{out}/V\text{ref}=(1+R*C*\text{Freq ss})^2/(AVDD*R*C)$.

The Op-amp is illustrated here by the sum element 601.

In summary, the herein described oscillator arrangement may achieve a stable clock frequency insensitive to supply and temperature variation with low current consumption and low area. This may be achieved by using Vref and Vout as input signals to the Op-Amp, both signals being directly derived from the supply voltage. In a further embodiment, a trimming resistor may be used in the frequency to voltage converter for adjusting the frequency.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

The invention claimed is:

1. An oscillator arrangement for generating a clock signal, the oscillator arrangement comprising
a current controlled oscillator,
a frequency to voltage converter, and
an operational amplifier,
wherein the oscillator arrangement is connectable to a supply voltage source,
wherein the current controlled oscillator is adapted to generate a clock signal based on a control voltage signal, wherein the generated clock signal is supplied to the frequency to voltage converter,
wherein the frequency to voltage converter is adapted to generate an output voltage signal based on the generated clock signal and based on a supply voltage signal, said output voltage signal being directly derived from the supply voltage signal,
wherein the operational amplifier is adapted to receive the output voltage signal as a feedback signal at a first input terminal and to receive a reference voltage signal at a second input terminal, the reference voltage signal being directly derived from the supply voltage signal, such that variations in the supply voltage signal appear on the first input terminal and the second input terminal in the same amplitude and phase,
wherein the current controlled oscillator is adapted to be controlled based on an output signal of the operational amplifier, wherein the output signal of the operational amplifier provides the control voltage signal to the current controlled oscillator in order to control the frequency of the clock signal.

2. The oscillator arrangement according to claim 1, further comprising an NMOS device, wherein the current controlled oscillator is connectable to the supply voltage source via the NMOS device, the NMOS device being controlled by the output signal of the operational amplifier.

3. The oscillator arrangement according to claim 2, wherein the NMOS device is adapted to convert an input error voltage corresponding to the output signal of the operational amplifier into a current for controlling the current controlled oscillator.

4. The oscillator arrangement according to claim 1, further comprising a voltage divider being adapted to generate the reference voltage from the supply voltage signal, wherein the voltage divider is coupled between the voltage supply and the second input terminal of the operational amplifier.

5. The oscillator arrangement according to claim 1, further comprising a level shifter unit being coupled between the current controlled oscillator and the frequency to voltage converter, wherein the level shifter unit is adapted to convert the clock signal being generated by the current controlled oscillator into a rail-to-rail clock signal.

6. The oscillator arrangement according to claim 5, wherein the frequency to voltage converter is adapted to generate the output voltage signal based on the rail-to-rail clock signal.

7. The oscillator arrangement according to claim 1, wherein the frequency to voltage converter is implemented based on a switched capacitor resistor arrangement.

8. The oscillator arrangement according to claim 7, wherein the frequency to voltage converter comprises a trimming resistor being part of the switched capacitor resistor arrangement, wherein the value of the trimming resistor is adjustable in order to adapt the frequency of the switched capacitor resistor arrangement.

9. The oscillator arrangement according to claim 8, wherein the trimming resistor comprises a plurality of resistors, each resistor being controlled by a transistor.

10. The oscillator arrangement according to claim 1, wherein the frequency to voltage converter comprises a logic unit, the logic unit being adapted to change a frequency operation mode of the oscillator arrangement.

11. A semiconductor device, the semiconductor device comprising an oscillator arrangement according to claim 1.

12. A method of generating a clock signal,
the method comprising
generating, by a current controlled oscillator, a clock signal based on a control voltage signal, wherein the generated clock signal is supplied to a frequency to voltage converter,
generating, by the frequency to voltage converter, an output voltage signal based on the generated clock signal and based on a supply voltage signal, said output voltage signal being directly derived from the supply voltage signal,
receiving, by an operational amplifier, the output voltage signal as a feedback signal at a first input terminal and receiving, by the operational amplifier, a reference voltage signal at a second input terminal, the reference voltage signal being directly derived from the supply voltage signal, such that variations in the supply voltage signal appear on the first input terminal and the second input terminal in the same amplitude and phase,
controlling the current controlled oscillator based on an output signal of the operational amplifier, wherein the output signal of the operational amplifier provides the control voltage signal to the current controlled oscillator in order to control the frequency of the clock signal.

13. A non-transitory computer-readable medium, in which a computer program of generating an oscillation is stored, which computer program, when being executed by a processor, is adapted to carry out the method according to claim 12.

\* \* \* \* \*